(12) United States Patent
Joist et al.

(10) Patent No.: US 9,863,717 B2
(45) Date of Patent: Jan. 9, 2018

(54) HEAT TRANSFERRING DEVICE

(71) Applicant: Pentair Technical Solutions GmbH, Straubenhardt (DE)

(72) Inventors: Michael Joist, Gaggenau (DE); Stefan Curatolo, Muggensturm (DE)

(73) Assignee: Pentair Technical Solutions GMBH, Straubenhardt (DE)

( * ) Notice: Subject to any disclaimer, the term of this patent is extended or adjusted under 35 U.S.C. 154(b) by 181 days.

(21) Appl. No.: 14/857,127

(22) Filed: Sep. 17, 2015

(65) Prior Publication Data

US 2016/0084590 A1 Mar. 24, 2016

(30) Foreign Application Priority Data

Sep. 19, 2014 (EP) .................................... 14185527
Mar. 12, 2015 (EP) .................................... 15158736

(51) Int. Cl.
*F28F 5/00* (2006.01)
*H05K 7/20* (2006.01)
*H01L 23/433* (2006.01)

(52) U.S. Cl.
CPC ............ *F28F 5/00* (2013.01); *H01L 23/4338* (2013.01); *H05K 7/20445* (2013.01); *H01L 2924/0002* (2013.01)

(58) Field of Classification Search
CPC ..... H05K 7/20445; H05K 7/2049; F28F 5/00; F28F 2275/18; H01L 23/4338
See application file for complete search history.

(56) References Cited

U.S. PATENT DOCUMENTS

| 4,908,695 A * | 3/1990 | Morihara ............ H01L 23/4338 257/719 |
| 5,184,281 A * | 2/1993 | Samarov ............ H05K 7/20509 165/185 |
| 2004/0206478 A1* | 10/2004 | Delano .................... F28F 13/00 165/81 |
| 2005/0047092 A1* | 3/2005 | Whit .................... H01L 23/4338 361/704 |
| 2007/0019384 A1 | 1/2007 | Berkenbush et al. |
| 2007/0030656 A1 | 2/2007 | Ross et al. |
| 2009/0229808 A1 | 9/2009 | Chu |
| 2013/0235529 A1* | 9/2013 | Yang .................... H01L 23/4338 361/704 |

FOREIGN PATENT DOCUMENTS

| JP | EP 0354722 A2 * | 2/1990 | ......... H01L 23/4338 |
| WO | WO 2013/135595 A1 | 9/2013 | |

* cited by examiner

*Primary Examiner* — Tho V Duong
(74) *Attorney, Agent, or Firm* — Quarles & Brady LLP

(57) ABSTRACT

A heat transferring device comprises two massive thermally conductive bodies arranged vertically on top of one another and spaced apart by a variable distance. One or more spreading elements are positioned between the thermally conductive bodies and respectively comprise two horizontally movable wedges with wedge tips pointing in opposite directions and a spring pressing apart the wedges. The thermally conductive bodies have corresponding sliding surfaces extending parallel to the wedge surfaces. Motion of the wedges in the horizontal direction is converted into vertical motion of the thermally conductive bodies to thereby automatically adapt the height of the entire device to a respective installation situation.

20 Claims, 9 Drawing Sheets

HEAT TRANSFERRING DEVICE

RELATED APPLICATIONS

This application claims priority to EP 14 185 527.0, filed Sep. 19, 2014, and also claims priority to EP 15 158 736.7, filed Mar. 12, 2015, both of which are hereby incorporated herein by reference in their entireties.

BACKGROUND

The invention pertains to a device for transferring device heat between a heat source and a heat sink by means of thermal conduction. Such a heat exchanger is used, in particular, in industrial electronics in order to dissipate the thermal power loss of electronic components.

Electronic components such as, for example, microprocessors are positioned on printed circuit boards that are typically installed in a housing. In a so-called single board computer, all essential electronic components of the computer are arranged on a single printed circuit board, namely the so-called motherboard. The formats of these motherboards have the tendency to become smaller and smaller such as, for example, the standardized Mini-ITX with dimensions of 170×170 mm, in the center of which a powerful processor is positioned.

Modern multi-core processors with high clock rate have such a high thermal power loss that they require purposeful cooling in order to operate reliably. This is typically realized with the aid of a heat sink that is attached to the planar surface of the processor and features a plurality of cooling ribs such that the waste heat can be dissipated into the surrounding air from a large surface by means of convection.

In many applications, the electronic components of a device need to be enclosed in a housing in order to protect them from dust, moisture and perturbing radiation. The housing may feature air inlet and air outlet openings and/or be equipped with an electric fan that blows cooling air through the housing in order still dissipate the waste heat generated in the interior of the device outward. However, a completely closed housing is required in many applications in order to fulfill stricter requirements with respect to the protection against dust and moisture.

Housings for electronic devices, particularly industrial computers with higher IP protection rating, are tightly closed all around such that cooling air can no longer be conveyed through the housing. Instead, such closed housings feature on their outer sides large heat sinks that are realized, for example, in the form of extruded profiles. In this case, it is problematic to thermally connect the electronic components in the interior of the housing, particularly the processor or the processors, to the heat sinks on the outer side of the housing such that the thermal power losses can be transferred to the heat sinks by means of thermal conduction and then dissipated into the surroundings by means of convection and/or thermal radiation.

It is known to use massive metal blocks that are attached to the processor with their underside and contact the inner side of a housing wall with their upper side in order to transfer heat from the processor to the housing wall. In this case, one problem can be seen in the relatively broad tolerances of the electronic and mechanical components, particularly the processors and the components of the protective housing. Just the structural height of a commercially available processor in the installed state has a typical tolerance of up to 1 mm. This is the reason an elastic or pasty material with sound thermal conductivity is frequently used at the heat transfer point. However, the thickness of the layer of thermally conductive paste needs to be maintained as small as possible because even the thermal conductivity of the best products available is several orders of magnitude lower than the thermal conductivity of metal, for example aluminum. The thermal resistance becomes even higher if the other end of the metal block is also brought in thermal contact with the housing wall by means of thermally conductive pastes.

In the construction and production of standardized small housings for industrial computers, another problem can be seen in that it should be possible to use different types of processors although the dimensions of the printed circuit board are predefined. Processors with different performance of different manufacturers such as Intel, AMD, ARM or VIA not only differ with respect to their electronic parameters and thermal power losses, but also with respect to their geometric dimensions. Although heat sinks and heat exchangers that can be universally utilized are offered for these processors, the required installation material must compensate the tolerances for the entire construction. The tolerances for the thickness of the processor, the socket, the heat sink or heat exchanger and, if applicable, the housing therefore add up to a value on the order of 2 mm or even more. Such large tolerances can no longer be compensated with thermally conductive paste or so-called gap filler if effective cooling should still be ensured.

Another challenge in this context can be seen in that at least the upper cover of a completely closed housing should be removable in order to access the enclosed electronics when necessary. When the cover is replaced after a repair, the thermal conductivity between the processor and the cover also needs to be completely restored. However, thermally conductive paste is not well suited for multiple use.

US 2007/0030656 A1 describes a thermal transferring device with variable height. It comprises two massive bodies that engage into one another, wherein the first body is in contact with a heat-emitting component and the second body can be vertically displaced relative to the first body. A spring is arranged between the two bodies and presses the upper body upward against the inner side of a housing cover. The spring pressure ensures that the upper body is always in contact with the housing cover, namely even if its height relative to the bottom of the housing varies, for example, due to manufacturing tolerances. In this known heat exchanger, the lower thermally conductive body is realized in the form of a piston and the upper thermally conductive body is realized in the form of a cylinder, in which the piston can slide up and down. This results in long vertical gaps between the two bodies that interrupt the heat transfer over a large surface. The gap or the clearance between the two bodies cannot fall short of a certain minimum dimension if the mobility of the two bodies relative to one another should not be impaired or even inhibited. It is therefore proposed to apply a lubricant, preferably a lubricating oil with increased thermal conductivity, onto the surfaces that slide relative to one another.

SUMMARY

In light of the above-described problems, this disclosure teaches an improved heat transferring device that can compensate a relatively broad tolerance range and is nevertheless characterized by maximum thermal conductivity.

In exemplary embodiments, the inventive heat exchanger has two massive thermally conductive bodies that are arranged vertically on top of one another and spaced apart by a variable distance. At least one spreading element comprising two horizontally movable wedges is positioned between the two bodies. The wedge tips point in opposite directions. At least one spring is provided for moving the wedges along a horizontal axis, i.e., for pressing apart or pulling together the wedges. On their sides that face one another, the thermally conductive bodies have corresponding sliding surfaces that are arranged in pairs. The wedge surfaces slide on the sliding surfaces of the thermally conductive bodies in such a manner that a motion of the wedges in the horizontal direction is converted into a vertical motion of the thermally conductive bodies. Vice versa, a vertical motion of the thermally conductive bodies as a result of external pressure leads to a sliding motion of the wedges in the horizontal direction against the force of the spring. In this case, the wedge surfaces always extend parallel to the sliding surfaces.

The force of the spring, which is compensated by the pressure exerted upon the upper thermally conductive body, ensures that the wedge surfaces always contact the sliding surfaces of the thermally conductive bodies without a noteworthy gap. Nevertheless, the vertical distance between the two thermally conductive bodies is variable such that the height of the heat exchanger is automatically adapted to the structural circumstances, for example in order to compensate the different heights of processors or manufacturing tolerances of the housing. The spring also ensures that the wedge surfaces of the wedges are always pressed against the sliding surfaces of the thermally conductive bodies such that a sound heat transfer between the wedges and the thermally conductive bodies is realized. The thermally conductive bodies and the wedges therefore form an almost completely massive body with minimal thermal resistance between the external contact surfaces.

The wedges preferably have a cross section, in which the wedge surfaces lie on the sides of an isosceles triangle. The shape of the wedges therefore is symmetrical relative to a horizontal axis extending transverse to the moving direction of the thermally conductive bodies. This results in a vertical stroke that is twice as large as that of wedges with only one oblique wedge surface. However, it would basically also be conceivable to use different cross-sectional shapes for the wedges such as, for example, the shape of a transverse right-angled triangle, in which one wedge surface, preferably the upper wedge surface, extends obliquely and the other wedge surface extends parallel to the horizontal line.

In order to achieve a large vertical stroke over a short horizontal distance, it is advantageous to arrange the wedge surfaces at an obtuse angle. This is possible because the weights to be moved and therefore the frictional forces between the wedge surfaces and the sliding surfaces are relatively low. In other embodiments, it may be advantageous to arrange the wedge surfaces at an angle of less than 90 degrees.

Due to the triangular shape of the wedges and their opposite motion, the pairs of sliding surfaces on the thermally conductive bodies are respectively arranged in the shape of a V or inverted V, wherein the angle between two abutting sliding surfaces and the angle between the wedge surfaces add up to 180 degrees. The wedge surfaces consequently always extend parallel to the sliding surfaces, wherein this is important for producing the best thermal contact possible between the wedges and the thermally conductive bodies. The deflection of the spring force in the vertical direction by means of the wedges ensures that the wedge surfaces are, independently of their position, pressed against the corresponding sliding surfaces in a planar manner with practically no gap.

The spring is preferably arranged between the wedges, wherein the spring force moves the wedges in the horizontal direction. It would alternatively also be possible to provide one or more springs that act upon the outer sides of the wedges on the far side referred to the wedge tips in order to move the wedges along the horizontal axis and to simultaneously press the wedges against the sliding surfaces of the thermally conductive bodies.

In a preferred embodiment, the two horizontally movable wedges of the spreading element have wedge tips that point away from one another. The spring positioned between the wedges preferably presses the wedges apart from one another. Consequently, the wedge tips respectively point in the direction, in which they are pressed by the spring.

The spring arranged between the wedges is preferably realized in the form of a coil spring, wherein the spring axis preferably lies in a horizontal plane through the wedge tips. It is advantageous to adjacently arrange two or more springs parallel to one another in order to prevent tilting of the wedges.

If the wedges and the wedge surfaces are arranged symmetrical to both sides of the same horizontal plane, an overall symmetrical arrangement is achieved that provides kinematic advantages, particularly with respect to an automatic centering of the wedges in the bearing formed together with one respective sliding surface of the two thermally conductive bodies. Tilting of the thermally conductive bodies is thereby prevented.

The thermally conductive bodies may be connected to one another by a guide in such a manner that they essentially can only be moved relative to one another in the vertical direction, but not yield laterally. This vertical guide may advantageously feature a stop that limits the maximum displacement of the thermally conductive bodies relative to one another. The heat exchanger is also prevented from falling apart when the spring is completely relaxed, i.e., when the thermally conductive bodies are spaced apart from one another by the maximum distance, such that the installation is simplified.

Instead of providing only one spreading element with two wedges and at least one spring, it would also be possible to arrange two identically designed spreading elements horizontally adjacent to one another. In this case, the two thermally conductive bodies respectively feature two pairs of V-shaped sliding surfaces, on which the wedges of one of the two spreading elements respectively slide. The arrangement of two identical spreading elements is particularly advantageous for slightly wider heat exchangers because it automatically ensures a constant tension between both thermally conductive bodies over their entire width. It would also be conceivable to arrange more than two spreading elements horizontally adjacent to one another for even wider heat exchangers.

The thermally conductive bodies are preferably manufactured in one piece in the form of an extruded profile. The material preferably consists of a metal with very good thermal conductivity, particularly aluminum or copper. The wedges may also be manufactured in one piece in the form of an extruded profile of the same or a different material with sound thermal conductivity.

It is particularly advantageous if both thermally conductive bodies are manufactured of the same extruded profile. In this case, the upper thermally conductive body merely differs from the lower thermally conductive body in that it is turned by 180 degrees. Since the wedges are also realized identically, the entire heat exchanger can essentially be assembled of only three parts, namely of two identical thermally conductive bodies, at least two identical wedges and one spring or several identical springs. In this case, the optional vertical guide for the thermally conductive bodies including its stop may be realized in the form of webs that are integrally formed on the thermally conductive bodies such that the manufacture of additional parts is also not required in this respect.

In an alternative embodiment of the inventive heat exchanger, the two horizontally movable wedges of the at least one spreading element are arranged in such a manner that the wedge tips point toward one another. In this case, it is advantageous if the spring pulls the wedges together rather than pressing them apart. The spring consequently also acts in the direction, in which the wedge tips point. In all instances, a motion of the wedges in the horizontal direction is coupled to a vertical motion of the thermally conductive bodies and vice versa.

The spring of the at least one spreading element may also be realized in the form of a rubber spring that connects the two wedges to one another instead of a coil spring. Such a rubber spring is preferably realized massively and advantageously consists of a highly elastic material such as, for example, an elastomer. When the rubber spring is pulled apart, it builds up a tensile force that pulls the wedges together as a function of its extension. The construction can be realized in a particularly simple manner when a spring of rubbery-elastic material is used. Instead of using a central spring, it would also be possible to adjacently arrange several springs parallel to one another.

It would naturally also be possible, in principle, to pull the wedges together by means of a coil spring of spring steel that is deflected beyond the neutral position.

The wedges preferably feature fastening grooves extending transverse to the moving direction in the region of their wedge tips and the rubber spring features beads on two opposite ends, wherein said beads are seated in the fastening grooves with a positive fit and thereby allow the transmission of the tensile forces to the movable wedges. This design is advantageous, particularly if the heat exchanger has small dimensions, because the entire construction can be reduced to four simple metal parts and an elastic spring element. This makes it possible to construct particularly small and/or cost-effective heat exchangers.

In a particularly preferred embodiment, the thermally conductive bodies feature guide grooves extending transverse to the moving direction of the thermally conductive bodies and parallel to the fastening grooves of the wedges on their sides that face one another and the rubber spring has a cruciform cross section with a horizontal and a vertical line, wherein the beads are arranged on the ends of the horizontal line and the end regions of the vertical line engage into the guide grooves of the thermally conductive bodies. The guide grooves and the vertical lines of the rubber spring with cruciform cross section thereby form a guide for the thermally conductive bodies in the vertical direction whereas the horizontal lines of the cruciform cross section form the actual tension spring.

In another practical and advantageous embodiment, the guide grooves of the thermally conductive bodies have an undercut cross section and the rubber spring features bead-like enlargements seated in the guide grooves on the ends of the vertical line of its cruciform cross section. In this case, the bead-like enlargements remain vertically movable in the guide grooves in order to allow a variable distance between the thermally conductive bodies.

In this context, the terms "horizontal" and "vertical" are used for defining the arrangement and moving directions of the individual components of the heat exchanger relative to one another, but not for defining, e.g., the absolute angular position in space. The reason for this can be seen in that it is possible, in principle, to arbitrarily arrange the inventive heat exchanger in space such as, for example, between two vertically or obliquely extending surfaces of two bodies, between which heat should be transferred. However, processors of computers are typically installed into a housing such that their upper side, from which heat needs to be dissipated, actually is aligned about horizontally in space and the two thermally conductive bodies of the inventive heat exchanger therefore are also actually arranged about vertically on top of one another. In any case, protection is also claimed for heat exchangers, in which, for example, the thermally conductive bodies lie opposite of one another along a horizontal axis and the wedges of the at least one spreading element accordingly can be moved along a vertical axis—and therefore perpendicular or transverse to the moving direction of the thermally conductive bodies—such that a motion of the wedges in the vertical direction is converted into a horizontal motion of the thermally conductive bodies.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIG. 1b shows a side view of the heat transferring device according to FIG. 1a;

FIG. 2a shows the profile of the thermally conductive bodies of the heat transferring device according to FIG. 1a;

DESCRIPTION

The embodiments described below are not intended to be exhaustive or to limit the invention to the precise forms disclosed in the following description. Rather, the embodiments are chosen and described so that others skilled in the art may appreciate and understand the principles and practices of this disclosure.

As noted above, the terms "horizontal" and "vertical" are generally used herein to establish positions of individual components relative to one another rather than an absolute angular position in space. Further, regardless of the reference frame, in this disclosure terms such as "vertical," "parallel," "horizontal," "right angle," "rectangular" and the like are not used to connote exact mathematical orientations or geometries, unless explicitly stated, but are instead used as terms of approximation. With this understanding, the term "vertical," for example, certainly includes a structure that is positioned exactly 90 degrees from horizontal, but should generally be understood as meaning positioned up and down rather than side to side. Other terms used herein to connote orientation, position or shape should be similarly interpreted. Further, it should be understood that various structural terms used throughout this disclosure and claims should not receive a singular interpretation unless it is made explicit herein. By way of non-limiting example, the terms "spring," "conductive body," "spreading element," to name just a few, should be interpreted when appearing in this disclosure and claims to mean "one or more" or "at least one." All other terms used herein should be similarly interpreted unless it is made explicit that a singular interpretation is intended.

Figure 1A:
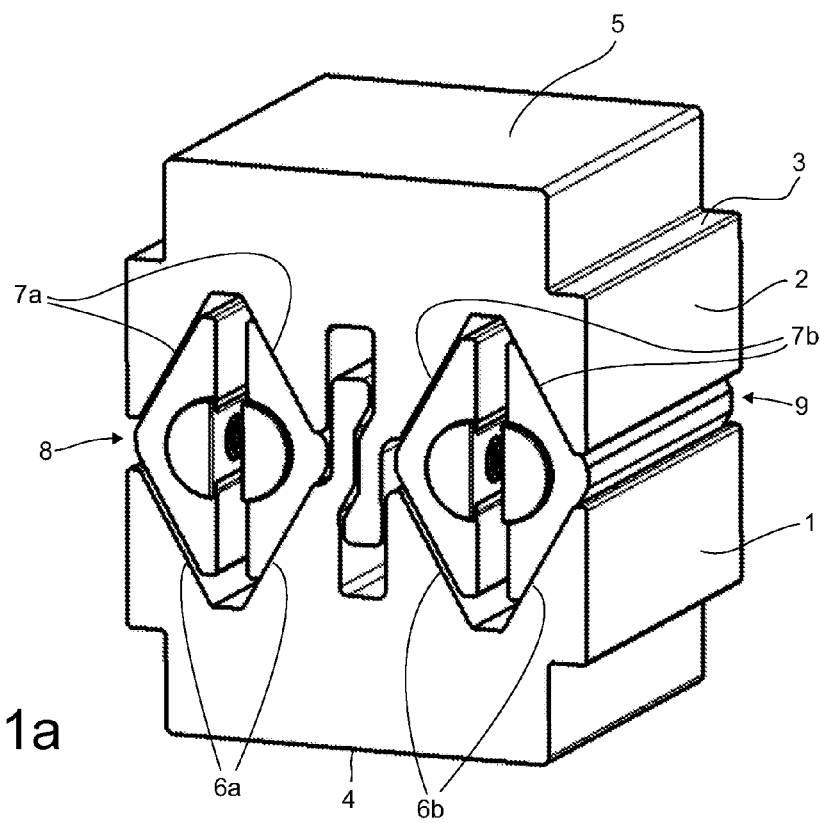
FIG. 1a shows an isometric view of a first heat transferring device.

FIG. 1a shows a heat transferring device with a first thermally conductive body 1 and a second thermally conductive body 2 that is arranged vertically above and spaced apart from the first thermally conductive body. The two thermally conductive bodies 1, 2 essentially have the shape of a rectangular cuboid, wherein the narrow end faces feature a step 3 such that the width of the thermally conductive bodies 1, 2 is slightly reduced in the region of their opposing ends. The underside of the first thermally conductive body 1 forms a first plane contact surface 4 and the upper side of the upper thermally conductive body 2 forms a second plane contact surface 5. These contact surfaces 4, 5 serve for producing surface contact with a (not-shown) component, from which heat should be dissipated, or with a component such as, for example, a housing cover that can absorb heat. The thermal gradient along the vertical axis of the heat transferring device causes a heat transfer between the two contact surfaces 4, 5 from the bottom toward the top or in the opposite direction, i.e., from the top toward the bottom.

Two pairs of sliding surfaces 6a, 6b and 7a, 7b are respectively formed on the sides of the thermally conductive bodies 1, 2 that lie opposite of the contact surfaces 4, 5. The sliding surfaces 6a, 6b of the lower thermally conductive body are arranged in the shape of a V; the sliding surfaces 7a, 7b of the upper thermally conductive body are also arranged in a V-shaped manner, but the V is inverted in this case. This means that the sliding surfaces 6a, 6b, 7a, 7b are arranged on the sides of altogether four isosceles triangles, wherein the points of two triangles respectively point in opposite directions such that a total of two diamonds are formed.

Two spreading element 8 and 9 are arranged horizontally adjacent to one another between the thermally conductive bodies 1, 2. The left spreading element 8 (also referred to herein as "spreaders") in FIGS. 1a, 1b comprises two wedges 10a, 10b with wedge tips that point away from one another, as well as a spring 11 arranged between the wedges. The identically designed second spreading element 9 (on the right side in FIG. 1b) likewise comprises two wedges 12a, 12b with tips that point away from one another and an intermediately arranged spring 13. The springs 11, 13 are realized in the form of coil springs in this case and press apart the corresponding wedges 10a, 10 and 12a, 12b in the horizontal direction. During this process, the wedge surfaces 14 respectively slide on the assigned sliding surfaces 6a, 6b of the lower thermally conductive body 1 and on the sliding surfaces 7a, 7b of the upper thermally conductive body 2. In this case, the wedge surfaces 14 and the corresponding sliding surfaces 6a, 6b and 7a, 7b extend parallel to one another, i.e., they contact one another over the entire surface with almost no gap.

Figure 1B:
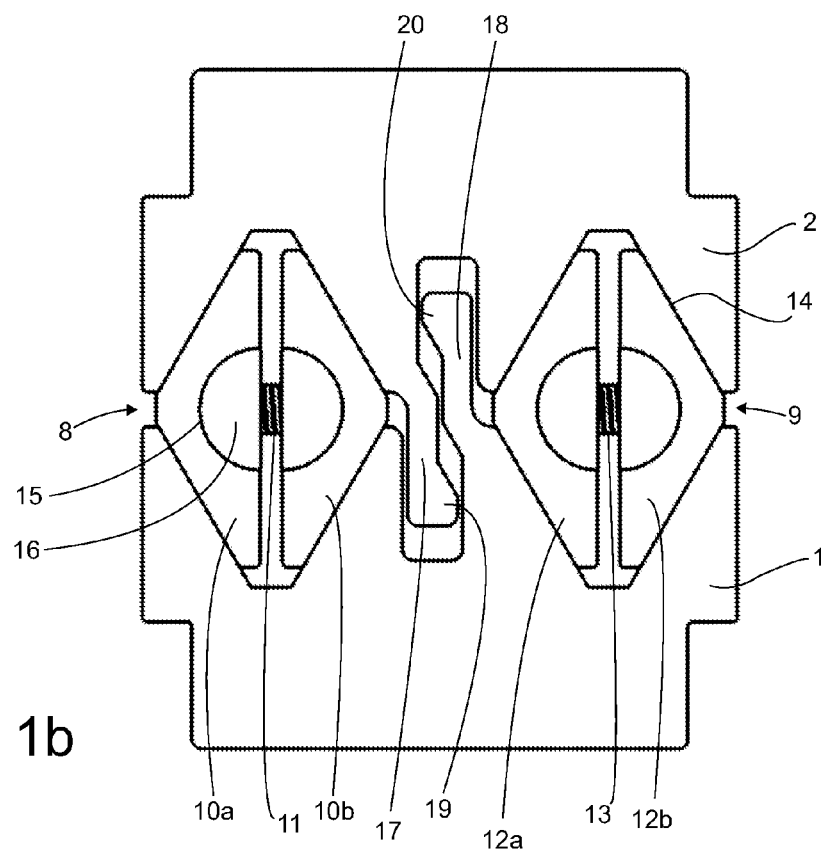

The sectional view according to FIG. 1b, in particular, shows that the wedges 10a, 10b, 12a, 12b feature semicircular grooves 15 on their rear sides that lie opposite of the wedge tips, wherein strips 16 that also have a semicircular cross section are seated in said grooves. The springs 11, 13 are braced against the plane upper side of the strips 16. In this case, the strips 16 can slightly turn in the grooves 15 and thereby compensate an inaccurate horizontal alignment of the thermally conductive bodies 1 and 2 relative to one another.

On their inner sides that face one another, the thermally conductive bodies 1, 2 feature mirror-inverted guide webs 17, 18 that, however, are slightly offset laterally and form a vertical guide for the thermally conductive bodies 1, 2. On their free ends, the guide webs 17, 18 are angled outward such that horizontal stops 19 and 20 are respectively formed. These stops 19, 20 limit the distance, by which the upper thermally conductive body 2 can move away from the lower thermally conductive body 1 in the vertical direction, wherein the guide webs 17, 18 are displaced parallel to one another and therefore define a purely vertical displacement of the thermally conductive bodies 1, 2 relative to one another.

Figure 2A:
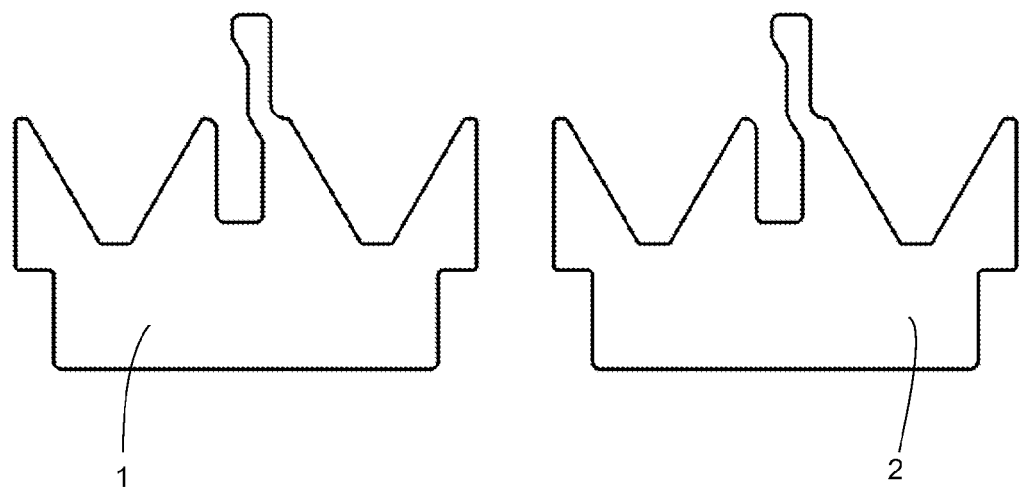
Figure 2B:
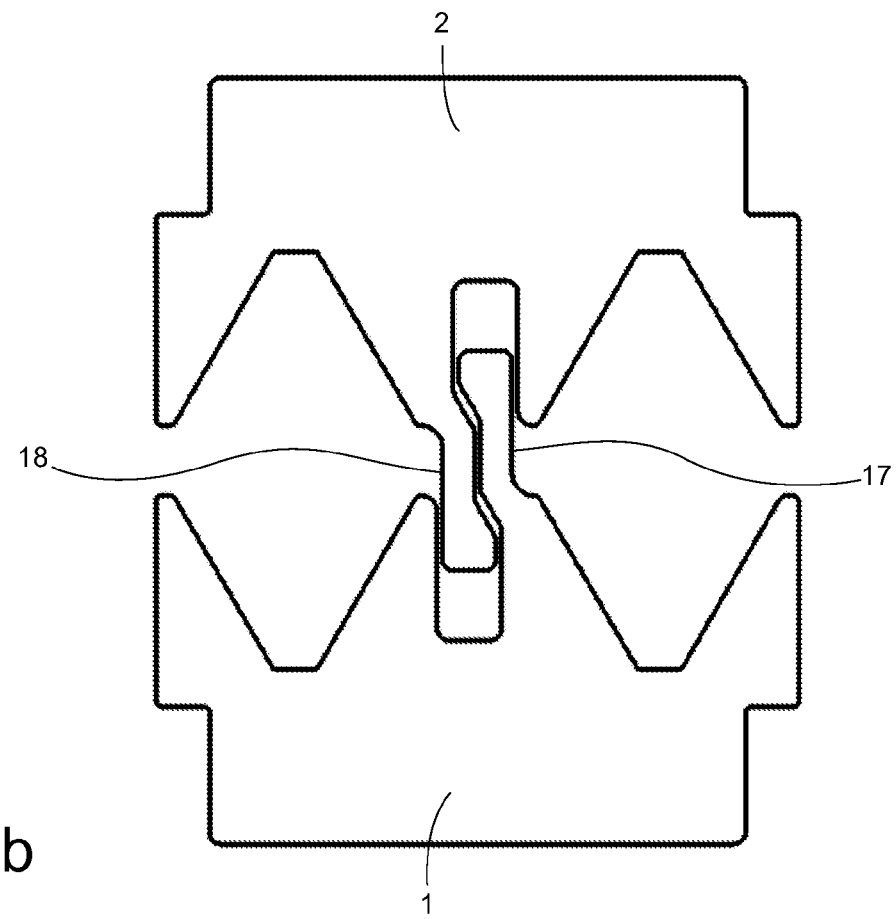
FIG. 2b shows the two thermally conductive bodies according to FIG. 1a in the assembled state.

The two thermally conductive bodies 1, 2 are illustrated separately in FIG. 2a. They are manufactured in one piece of the same extruded profile. FIG. 2a shows the two thermally conductive bodies 1, 2 arranged adjacent to one another whereas FIG. 2b shows the two thermally conductive bodies 1 and 2 in the assembled state. For this assembly, the upper thermally conductive body 2 was turned by 180 degrees and pushed on the lower thermally conductive body 1.

Figures 3A, 3B:
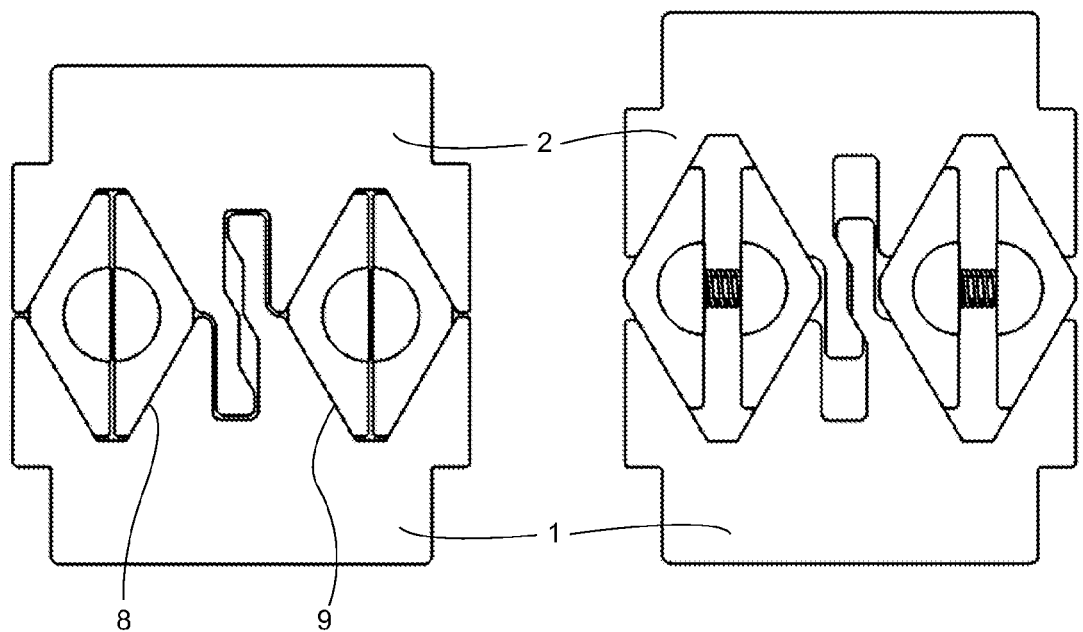
FIGS. 3a, 3b respectively show the heat transferring device according to FIG. 1a in the states, in which it is pressed together and pushed apart.

FIGS. 3a and 3b elucidate the function of the above-described heat transferring device. In FIG. 3a illustrated on the left side, the two thermally conductive bodies 1, 2 almost abut on one another, i.e., they are spaced apart by the minimal distance such that the entire heat exchanger has its minimum height. In FIG. 3b illustrated adjacent thereto on the right side, the two thermally conductive bodies 1, 2 are vertically spaced apart from one another by the maximal distance such that the heat exchanger has its maximum height. The difference between minimum and maximum height defines the variable distance between two (not-shown) components that can be connected by means of the heat transferring device in order to transfer heat. In this case, the springs 11, 13 ensure that the motion of the wedges 10a, 10b and 12a, 12b in the horizontal direction is converted into a vertical motion of the thermally conductive bodies 1, 2 relative to one another. In FIG. 3a, the springs 11, 13 are compressed as far as possible whereas they are almost completely relaxed in FIG. 3b. The stops 19, 20 on the guide webs 17, 18 limit the vertical motion of the upper thermally conductive body 2 relative to the lower thermally conductive body 1.

Figures 4A, 4B:
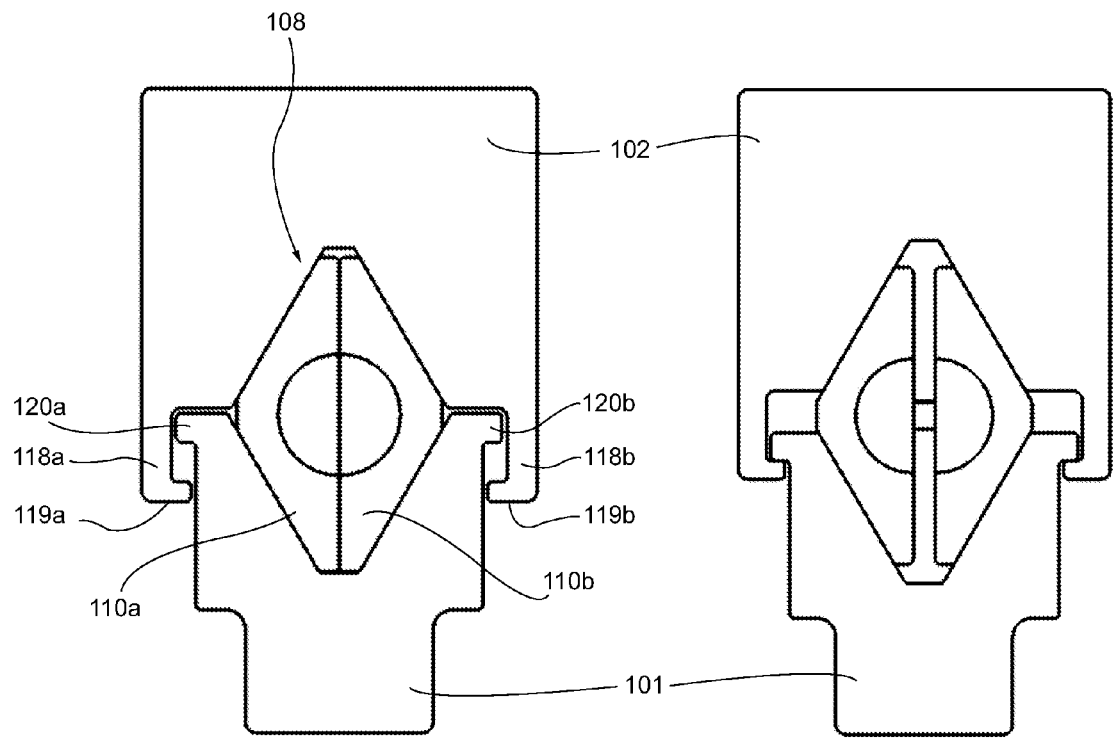
FIGS. 4a, 4b respectively show a side view of an alternative heat transferring device in the states, in which it is pressed together and pushed apart.

The sectional views according to FIGS. 4a, 4b show alternative embodiment of the heat transferring device. This heat exchanger also comprises a lower thermally conductive body 101 and an upper thermally conductive body 102 that is arranged vertically above and spaced apart from the first thermally conductive body 101 by a variable distance. The lower thermally conductive body 101 is slightly narrower than the upper thermally conductive body 102. In contrast to the first embodiment according to FIG. 1a, this second embodiment only features a single spreading element 108 that is arranged between the two thermally conductive bodies 101, 102 and comprises two horizontally movable wedges 110a, 110b, the wedge tips of which point in opposite directions.

In the embodiment according to FIGS. 4a, 4b, guide webs 118a, 118b are integrally formed on the right and the left side of the upper thermally conductive body 102 only and laterally encompass the lower thermally conductive body 101 by a certain distance. On their free ends, the guide webs 118a, 118b are bent inward and thereby form stops 119a, 119b. These stops cooperate with counterstops 120a, 120b on the lower thermally conductive body 101.

The spreading element 108 basically is realized identically to the two spreading element 8, 9 in the first embodiment of the heat exchanger (see FIGS. 1a, 1b). In addition to the wedges 110a, 110b, the spreading element 108 particularly comprises a (not-shown) spring that presses the wedges 110a, 110b apart in the horizontal direction.

In the embodiment according to FIGS. 4a, 4b, a motion of the wedges 110a, 110b in the horizontal direction also causes a vertical displacement of the upper thermally conductive body 102 relative to the lower thermally conductive body 101. The two thermally conductive bodies 101, 102 are spaced apart by the minimal distance in FIG. 4a whereas they are spaced apart by the maximal distance in FIG. 4b.

Figures 5A, 5B:
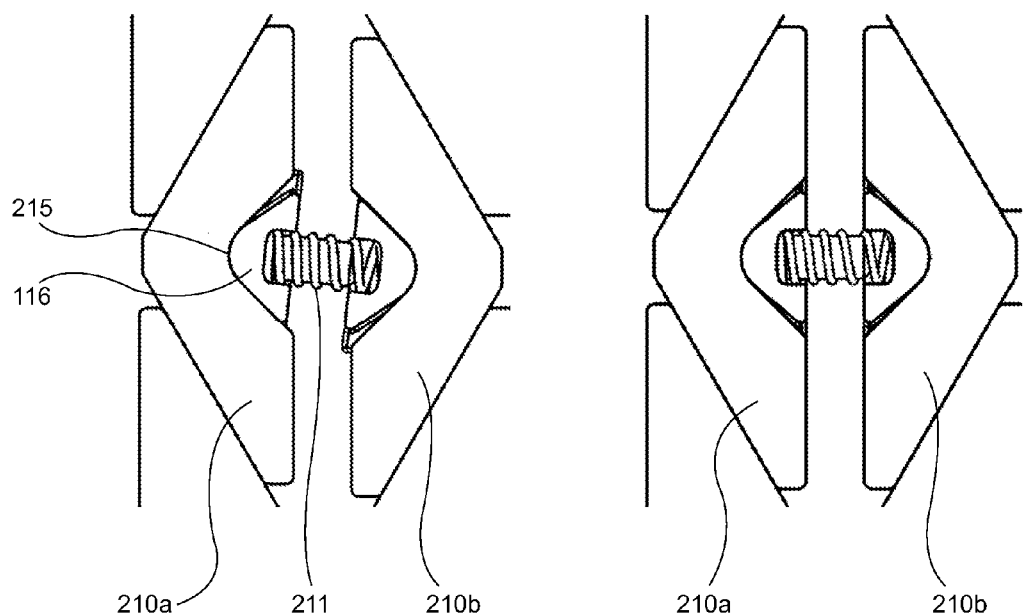
FIGS. 5a, 5b show a modification of the heat transferring device according to FIGS. 4a, 4b.

The detailed views according to FIGS. 5a and 5b show a modified embodiment of the respective spreading elements 8, 9 and 108. In this case, the wedges 210a, 210b feature grooves that do not have a semicircular cross-section, but rather a cross section in the shape of an isosceles triangle with rounded point. The strips 216 seated in the grooves 215 likewise have a cross section in the form of an isosceles triangle, but the angle included by the sides of this triangle is slightly smaller than the corresponding angle of the grooves 215. If the spring 211 is in an inclined position as illustrated in FIG. 5a, the strips 216 can tilt by a corresponding angle. An offset in height between the left wedge 210a and the right wedge 210b can thereby be compensated.

Figure 6A:
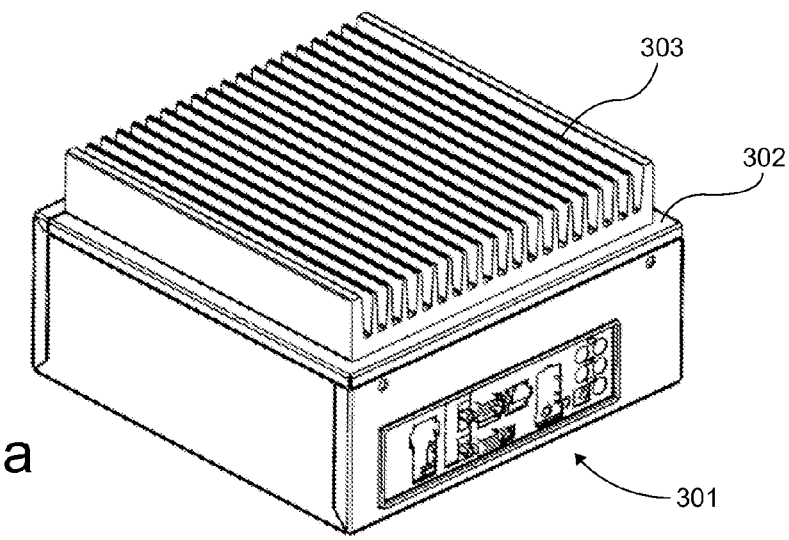
FIGS. 6a, 6b, 6c show the use of a heat transferring device according to FIG. 1a in a housing in the form of perspective views.
Figure 6B:
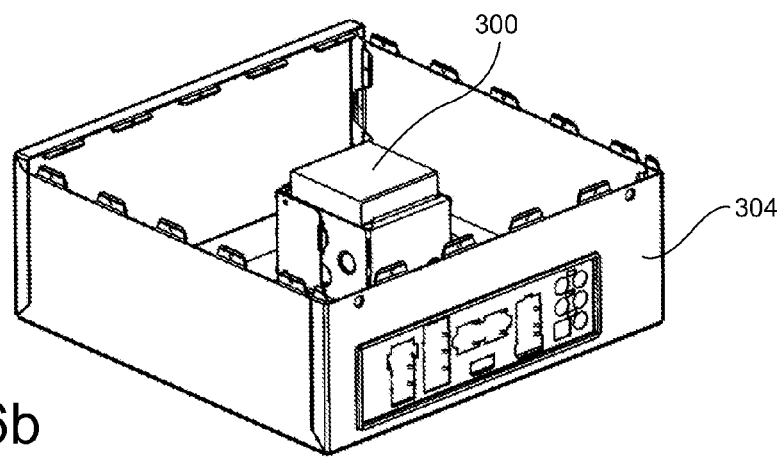
Figure 6C:
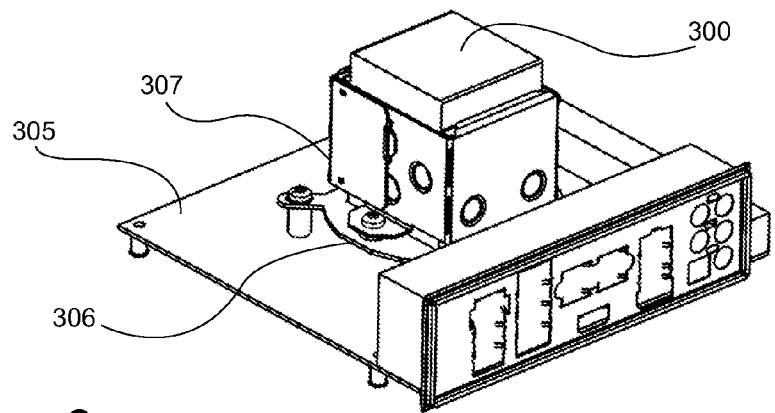

FIGS. 6a, 6b and 6c elucidate the utilization of a heat transferring device 300 of the above-described type.

FIG. 6a shows a closed housing 301 for installing electronic components, particularly of a Mini-ITX single board computer. The upper side of the cover 302 of the housing 301 is almost entirely occupied by a heat sink 303 that features a plurality of cooling ribs and therefore has a large cooling surface.

In FIG. 6b, the heat sink 303 is removed such that the interior of the housing 301 is visible. The sidewalls 304 are also not illustrated in FIG. 6c such that the motherboard 305 is visible. A processor 306, the thermal power loss of which must be dissipated, is positioned in the center of this motherboard. The heat transferring device 300 is attached to the flat upper side of the processor 306 for this purpose. In FIG. 6c, the lower thermally conductive body of the heat transferring device 300 is covered by an installation adapter 307. The motion of the upper thermally conductive body relative to the lower thermally conductive body, which is rigidly connected to the processor 306, is not impaired by this installation adapter 307.

Figure 7:
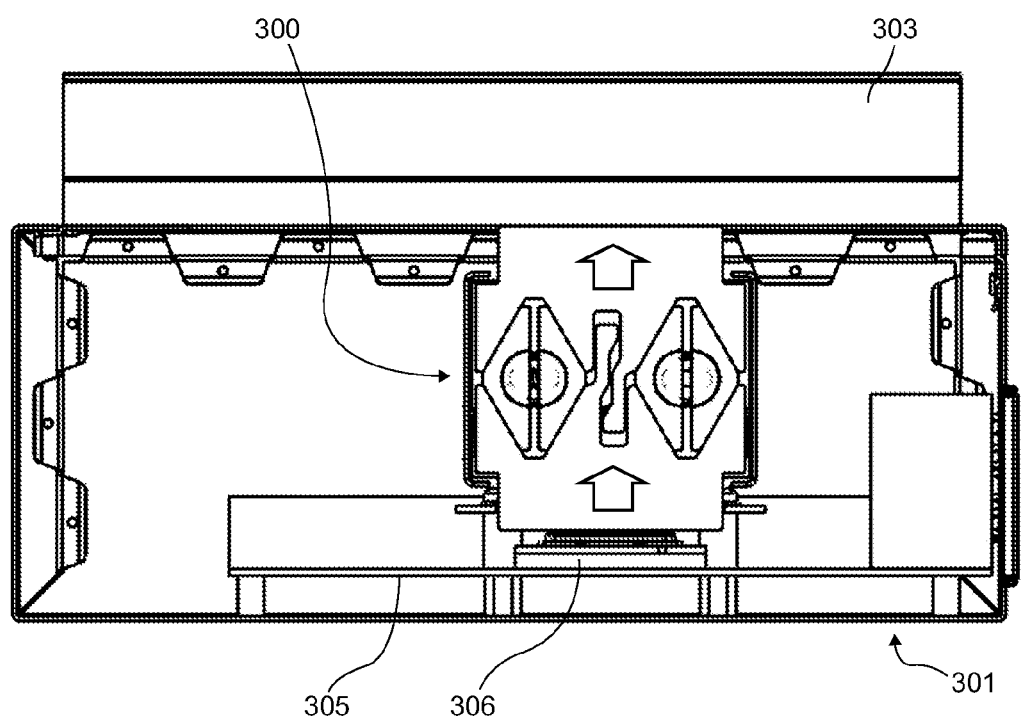
FIG. 7 shows a vertical section through a housing with a heat transferring device according to FIG. 6a installed therein.

In FIG. 7, the springs of the spreading elements are partially relaxed such that the plane upper side of the heat exchanger 300 is pressed against the underside of the heat sink 303 in a spring-loaded manner. Variations in size of the processor 306, as well as in the construction of the housing 301, are therefore automatically compensated in that the height of the heat exchanger 300 is automatically adapted.

The cross section according to FIG. 7 elucidates how the heat transferring device 300 inserted into the housing 301 conducts the thermal power loss of the processor 306 upward to the heat sink 303. The heat transfer is symbolized by the large arrows.

Figure 8A:
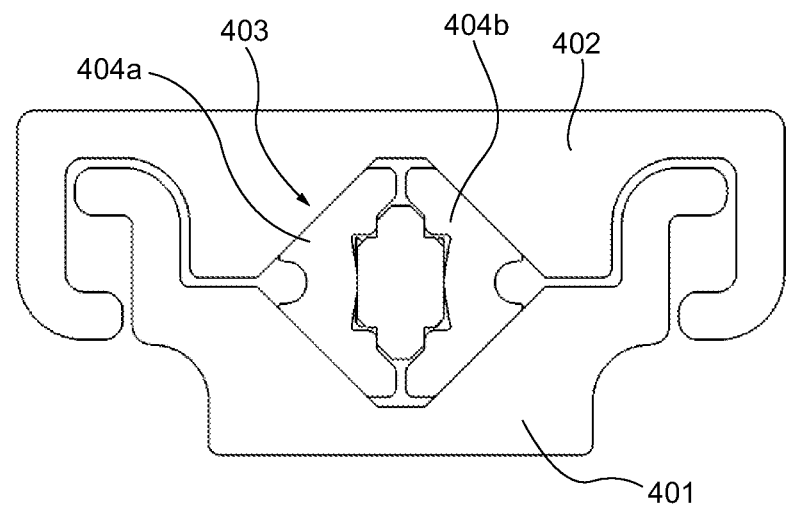
FIGS. 8a, 8b respectively show a side view of a third heat transferring device in the states, in which it is pressed together and pushed apart.
Figure 8B:
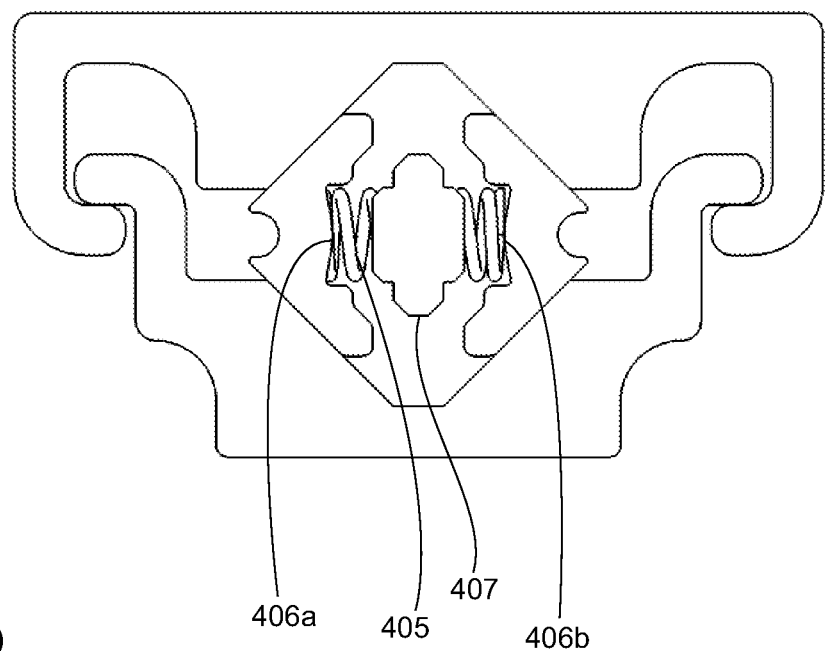

The third embodiment of an inventive heat exchanger illustrated in FIGS. 8a, 8b follows the same constructive principle as the heat transferring device according to FIGS. 4a, 4b. However, this heat transferring device has a flatter design and is optimized for smaller dimensions.

A spreading element 403 is arranged between a lower thermally conductive body 401 and an upper thermally conductive body 402. This spreading element comprises two wedges 404a, 404b, the (imaginary) tips of which point in opposite directions, namely outward. Several springs 405 are adjacently arranged parallel to one another between the wedges 404a, 404b, but only the front spring 405 is visible in the illustrations. Flat rectangular grooves 406a, 406b are formed on the inner sides of the wedges 404a, 404b that face one another, wherein said grooves accommodate and laterally fix the ends of the springs 405. The springs 405 consist of coil springs that are made of metal.

The springs 405 are compressed in the state, in which the heat transferring device is pushed together (FIG. 8a), whereas the springs 405 are partially relaxed when the lower thermally conductive body 401 and the upper thermally conductive body 402 spaced apart by the maximal distance (see FIG. 8b). The springs 405 are surrounded by guide elements 407 (also referred to as "guides") of plastic or metal that position and axially stabilize the springs 405 and simultaneously serve as stops for the wedges 404a, 404b (see FIG. 8a).

Figure 9A:
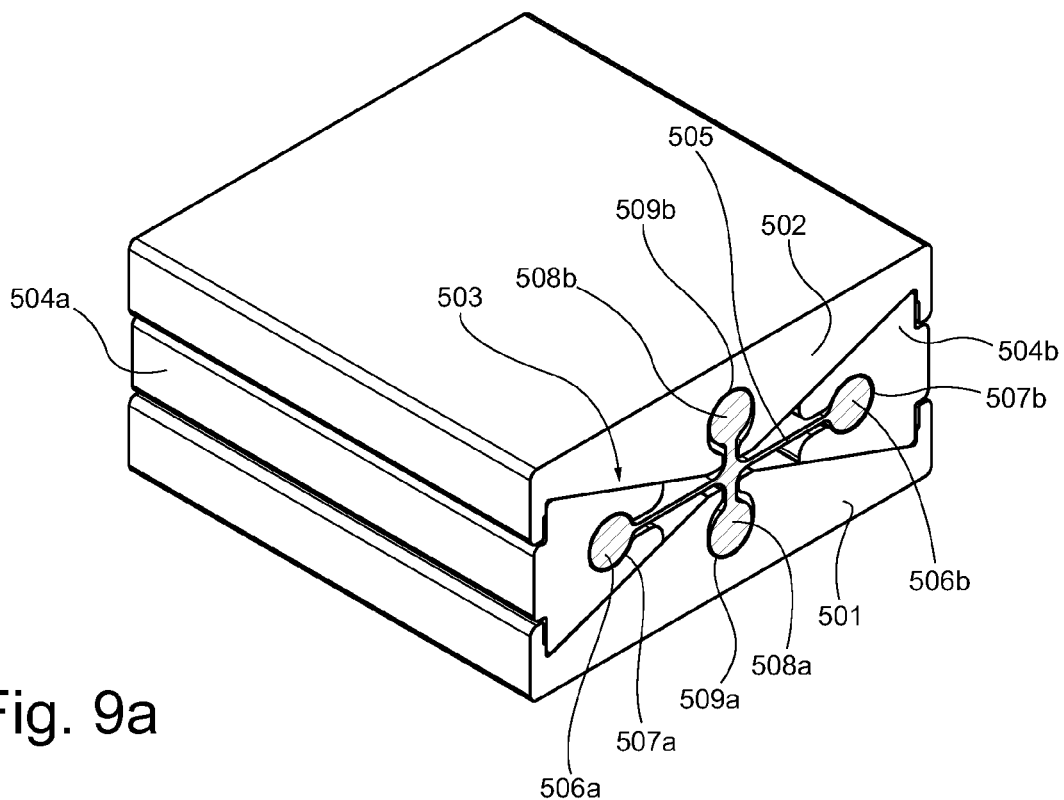
FIGS. 9a, 9b respectively show a fourth heat transferring device in the form of a perspective view and an exploded view, and FIGS. 10a, 10b respectively show a side view of the heat transferring device according to FIG. 9a in the states, in which it is pressed together and pushed apart.
Figure 9B:
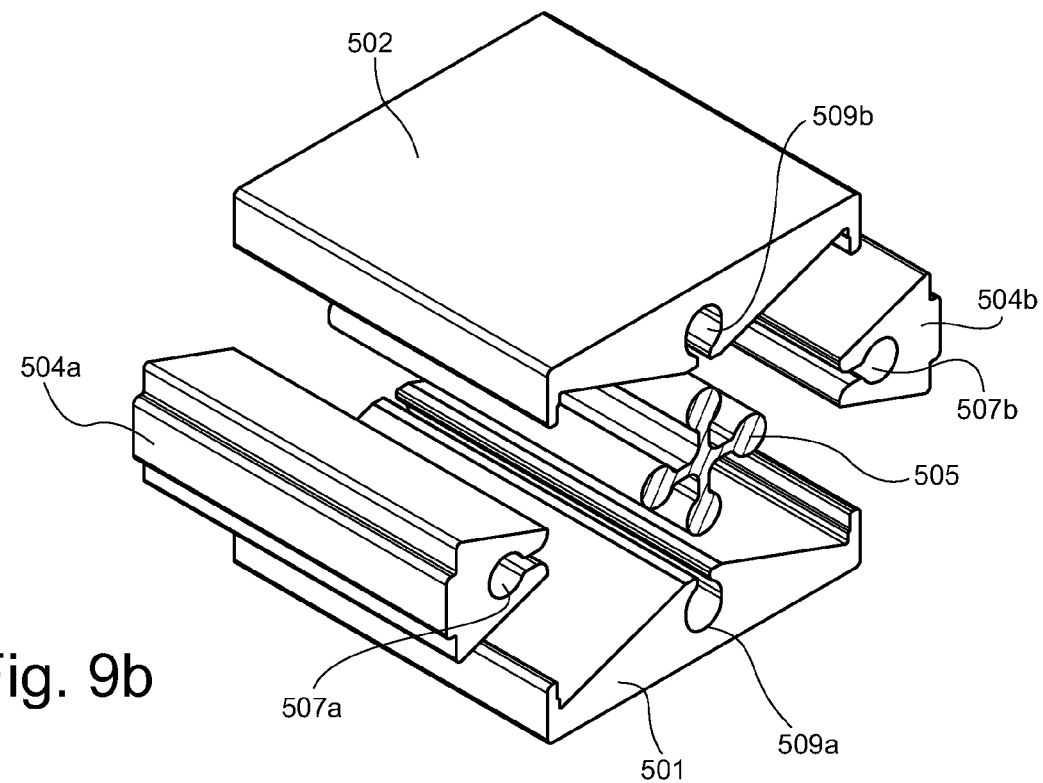

Another heat transferring device with an even simpler construction is illustrated in FIGS. 9a and 9b. This fourth variation is especially optimized for very small dimensions.

A lower thermally conductive body 501 and an upper thermally conductive body 502 have V-shaped cross sections and are arranged in a mirror-inverted manner relative to one another such that the V tips point toward one another. The spreading element 503 arranged between the thermally conductive bodies 501, 502 consists of two small wedges 504a, 504b, the (imaginary) tips of which point toward one another. The angle included by the wedge surfaces of the wedges 504a, 504b only amounts to approximately 40 degrees in this case. A rubber spring 505 is arranged between the wedges 504a, 504b.

The exploded view according to FIG. 9b shows the geometries of the altogether only five individual parts of the heat transferring device. The rubber spring 505 is manufactured in one piece of a highly elastic elastomer and has a cruciform cross section with a horizontal and a vertical line. Beads 506a and 506b are formed on the opposite ends of the horizontal line of the cruciform cross section. The wedges 504a, 504b have identical cross sections, but are arranged in a mirror-inverted manner, and feature respective fastening grooves 507a and 507b extending transverse to the moving direction in the region of the wedge tips. The beads 506a, 506b of the rubber spring 505 are seated in the fastening grooves 507a, 507b with a positive fit. This enables the rubber spring 505 to pull apart the wedges 504a, 504b. If the upper thermally conductive body 502 is pressed against the lower thermally conductive body 501, this automatically causes the wedges 504a, 504b to slide apart from one another such that the rubber spring 505 is elongated and builds up an elastic restoring force.

The end regions of the vertical line of the cruciform cross section of the rubber spring 505 transform into bead-like enlargements 508a, 508b. The thermally conductive bodies 501, 502 respectively feature corresponding guide grooves 509a and 509b, into which the bead-like enlargements 508a, 508b engage. In contrast to the beads 506a, 506b, the enlargements 508a, 508b are not connected to the guide grooves 509a, 509b with a positive fit, but rather are seated in the latter with play, particularly in the vertical direction. The vertical arms of the rubber spring 505 thereby form vertical guides for the thermally conductive bodies 501, 502 together with the guide grooves 509a, 509b.

Figure 10A:
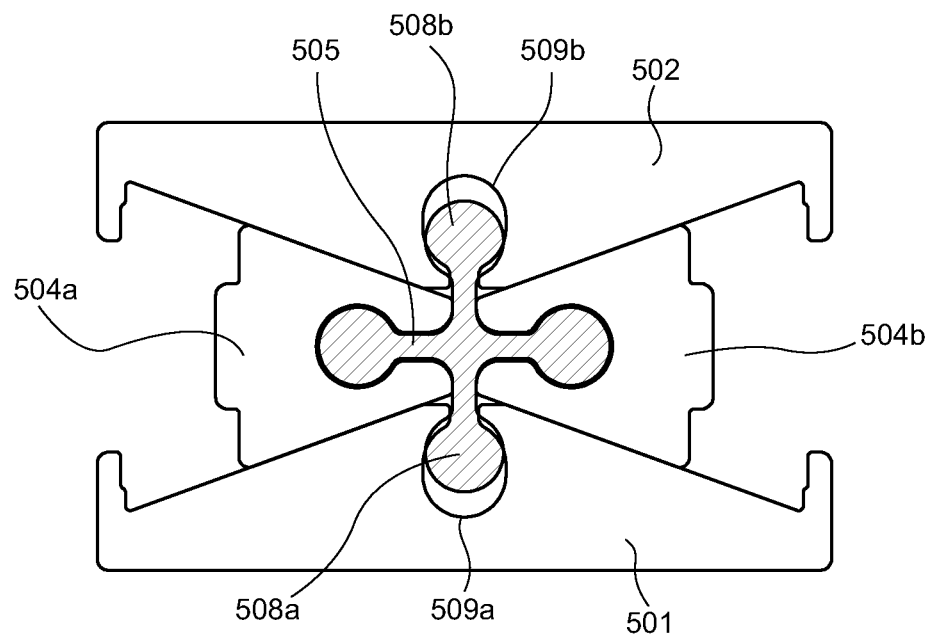

In FIG. 10a, the heat transferring device has its maximum height; the two thermally conductive bodies 501, 502 are spaced apart by the maximal distance. In this state, the tips of the wedges 504a, 504b almost contact one another and the X-shaped rubber spring 505 is relaxed.

Figure 10B:
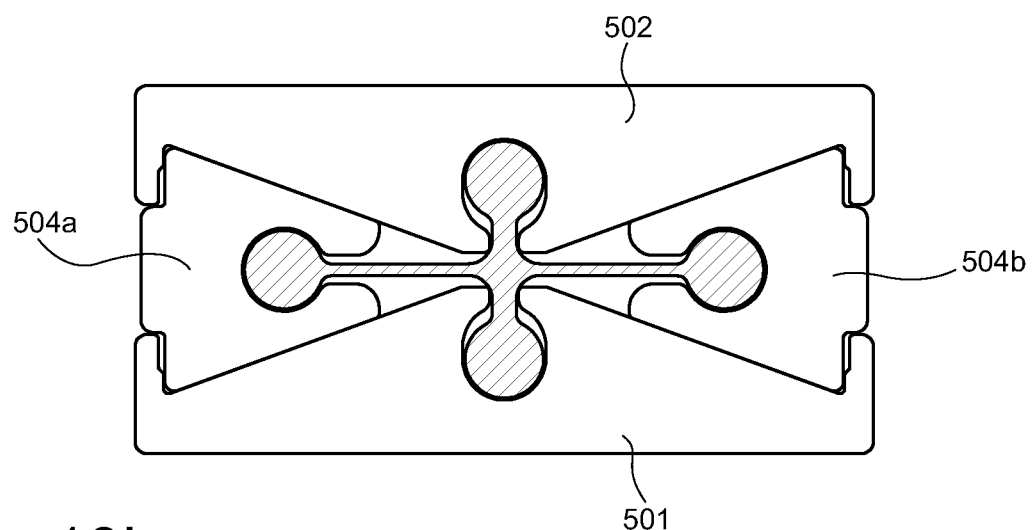

In FIG. 10b, the two thermally conductive bodies 501 and 502 are completely pressed together and the heat exchanger has its minimum height. The wedges 504a, 504b are now spaced apart from one another by the minimal distance and the rubber spring 505 is elongated to its maximum.

A comparison between FIG. 10a and FIG. 10b elucidates the function of the guide grooves 509a, 509b in cooperation with the vertical arms of the rubber spring 505 and the bead-like enlargements 508a, 508b arranged on their ends.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SYMBOLS

1 Lower thermally conductive body
2 Upper thermally conductive body
3 Step
4 Contact surface (of 1)
5 Contact surface (of 2)
6a, 6b Sliding surfaces (of 1)
7a, 7b Sliding surfaces (of 2)
8 Spreading element
9 Spreading element
10a, 10b Wedges (of 8)
11 Spring (of 8)
12a, 12b Wedges (of 9)
13 Spring (of 9)
14 Wedge surfaces (of 8, 9)
15 Grooves
16 Strips
17 Guide web (of 1)
18 Guide web (of 2)
19 Stop (of 17)
20 Stop (of 18)
101 Lower thermally conductive body
102 Upper thermally conductive body
108 Spreading element
110a, 110b Wedges (of 108)
118a, 118b Guide webs
119a, 119b Stops
120a, 120b Counterstops
210a, 210b Wedges
211 Spring
215 Grooves
216 Strips
300 Heat transferring device
301 Housing
302 Cover
303 Heat sink
304 Sidewalls
305 Motherboard
306 Processor
307 Installation adapter
401 Lower thermally conductive body
402 Upper thermally conductive body
403 Spreading element
404a, 404b Wedges (of 403)
405 Springs
406a, 406b Grooves (in 404a, 404b)
407 Guide elements
501 Lower thermally conductive body
502 Upper thermally conductive body
503 Spreading element
504a, 504b Wedges (of 503)
505 Rubber spring
506a, 506b Beads (of 505)
507a, 507b Fastening grooves
508a, 508b Enlargements (of 505)
509a, 509b Guide grooves

What is claimed is:

1. A heat transferring device, comprising:
two thermally conductive bodies arranged vertically on top of one another and spaced apart by a variable distance;
a spreader positioned between the two thermally conductive bodies and comprising two horizontally movable wedges each having two wedge surfaces, wedge tips of said two wedges pointing in opposite directions, the spreader further comprising a spring that moves the wedges along a horizontal axis, whereby the two thermally conductive bodies can be pressed apart from one another; and
each thermally conductive body having a pair of sliding surfaces on a side thereof, wherein the pairs of sliding surfaces face one another and each sliding surface extends parallel to a respective one of the wedge surfaces, further wherein the wedges slide on said sliding surfaces such that horizontal movement of the wedges is converted into vertical movement of the thermally conductive bodies.

2. The heat transferring device according to claim 1, wherein the two wedge surfaces of each wedge lie on the sides of an isosceles triangle.

3. The heat transferring device according to claim 2, wherein the two wedge surfaces of each wedge extend at an obtuse angle relative to one another.

4. The heat transferring device according to claim 1, wherein each pair of sliding surfaces forms a V-shape.

5. The heat transferring device according to claim 1, wherein the wedge tips of the two horizontally movable wedges point away from one another.

6. The heat transferring device according to claim 1, wherein the spring is arranged between the two wedges.

7. The heat transferring device according to claim 1, wherein the spring presses the wedges apart from one another.

8. The heat transferring device according to claim 1, wherein the spring comprises a coil spring, the spring axis of which lies in a horizontal plane through the wedge tips.

9. The heat transferring device according to claim 1, wherein the thermally conductive bodies are connected to one another by a guide such that they can only be moved vertically relative to one another.

10. The heat transferring device according to claim 9, wherein the guide comprises a stop that limits the vertical movement.

11. The heat transferring device according to claim 1, wherein the spreader comprises two spreaders arranged horizontally adjacent to one another and the sliding surfaces comprise a V-shape.

12. The heat transferring device according to claim 1, wherein the thermally conductive bodies are formed as one piece in the form of an extruded profile.

13. The heat transferring device according to claim 12, wherein the two thermally conductive bodies are identical.

14. The heat transferring device according to claim 1, wherein the wedge tips of the two horizontally movable wedges point toward one another and the wedges are pulled toward one another by the spring.

15. The heat transferring device according to claim 1, wherein the spring is formed of an elastomer and the two wedges are connected to one another by the spring.

16. The heat transferring device according to claim 15, wherein the wedges have fastening grooves extending transverse to a moving direction of the thermally conductive bodies, the fastening grooves located in the region of the wedge tips, and wherein the spring has beads on two opposite ends thereof, wherein said beads are seated in the fastening grooves with a positive fit.

17. The heat transferring device according to claim 16, wherein:
the thermally conductive bodies have guide grooves extending along the moving direction of the thermally conductive bodies;
the spring has a cruciform cross section defining a horizontal arm and a vertical arm;
the beads are arranged on ends of the horizontal arms and end regions of the vertical arm engage into the guide grooves of the thermally conductive bodies to thereby form a guide for the thermally conductive bodies in the vertical direction.

18. The heat transferring device according to claim 17, wherein the guide grooves of the thermally conductive bodies have an undercut cross section, and wherein the spring has bead-like enlargements that are seated in the guide grooves.

19. The heat transferring device according to claim 1, wherein the two wedges are identical.

20. The heat transferring device according to claim 1, wherein the two thermally conductive bodies are identical.

* * * * *